(12) United States Patent
Zhao et al.

(10) Patent No.: US 9,842,827 B2
(45) Date of Patent: Dec. 12, 2017

(54) WAFER LEVEL SYSTEM IN PACKAGE (SIP) USING A RECONSTITUTED WAFER AND METHOD OF MAKING

(71) Applicant: Avago Technologies General IP (Sinapore) Pte. Ltd., Singapore (SG)

(72) Inventors: Sam Ziqun Zhao, Irvine, CA (US); Rezaur Rahman Khan, Irvine, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 15/144,458

(22) Filed: May 2, 2016

(65) Prior Publication Data

US 2017/0301651 A1   Oct. 19, 2017

Related U.S. Application Data

(60) Provisional application No. 62/324,258, filed on Apr. 18, 2016.

(51) Int. Cl.
| | |
|---|---|
| *H01L 23/48* | (2006.01) |
| *H01L 23/52* | (2006.01) |
| *H01L 25/065* | (2006.01) |
| *H01L 23/00* | (2006.01) |
| *H01L 23/31* | (2006.01) |
| *H01L 23/367* | (2006.01) |
| *H01L 21/768* | (2006.01) |
| *H01L 21/56* | (2006.01) |
| *H01L 25/00* | (2006.01) |

(52) U.S. Cl.
CPC ........ *H01L 25/0657* (2013.01); *H01L 21/565* (2013.01); *H01L 21/76885* (2013.01); *H01L 23/3114* (2013.01); *H01L 23/3675* (2013.01); *H01L 23/481* (2013.01); *H01L 24/11* (2013.01); *H01L 24/13* (2013.01); *H01L 25/50* (2013.01); *H01L 2224/11334* (2013.01); *H01L 2224/13014* (2013.01); *H01L 2224/13016* (2013.01); *H01L 2224/13022* (2013.01); *H01L 2225/06548* (2013.01); *H01L 2225/06589* (2013.01); *H01L 2924/01029* (2013.01)

(58) Field of Classification Search
CPC ............... H01L 25/0657; H01L 21/565; H01L 21/76898; H01L 21/76885; H01L 23/3142; H01L 23/3672
USPC ........................................................ 257/692
See application file for complete search history.

(56) References Cited

U.S. PATENT DOCUMENTS

| | | | |
|---|---|---|---|
| 8,866,309 B2 * | 10/2014 | Chang ..................... | H01L 23/38 257/621 |
| 2013/0154106 A1 * | 6/2013 | Hu .......................... | H01L 24/96 257/774 |

* cited by examiner

*Primary Examiner* — Theresa T Doan
(74) *Attorney, Agent, or Firm* — Foley & Larnder LLP

(57) ABSTRACT

A package such as a system in package (SiP) includes a first die disposed in a first mold layer and coupled to a first dielectric layer disposed above the first mold and a second die disposed in a second mold layer and coupled to a second dielectric layer disposed above the second die. A pillar is disposed through the second mold layer and is coupled to a first metal layer disposed above the first dielectric layer. The first metal layer is coupled to the first die, and the pillar is coupled to a second metal layer disposed above the second dielectric layer.

20 Claims, 8 Drawing Sheets

WAFER LEVEL SYSTEM IN PACKAGE (SIP) USING A RECONSTITUTED WAFER AND METHOD OF MAKING

CROSS-REFERENCE TO RELATED APPLICATIONS

This application claims the benefit of and priority to U.S. Provisional Application No. 62/324,258, entitled "A WAFER LEVEL SYSTEM IN PACKAGE (SiP) USING A RECONSTITUTED WAFER," filed Apr. 18, 2016, which is hereby incorporated by reference herein in its entirety.

BACKGROUND OF THE DISCLOSURE

A number of integrated circuits (ICs) are enclosed in a single module or package to provide a system in package (SiP). The ICs are generally provided on dies which are stacked vertically on a package substrate. The dies are internally connected by fine wires that are bonded to the package substrate or by solder bumps that are used to join stacked chips together (e.g., flip chip technology). Conventional SiPs require a thick mold to accommodate the stacked IC dies and IC interconnections, such as, solder bumps on each packaged die, wire bonds or through mold via interconnections.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

DETAILED DESCRIPTION

Figure 1:
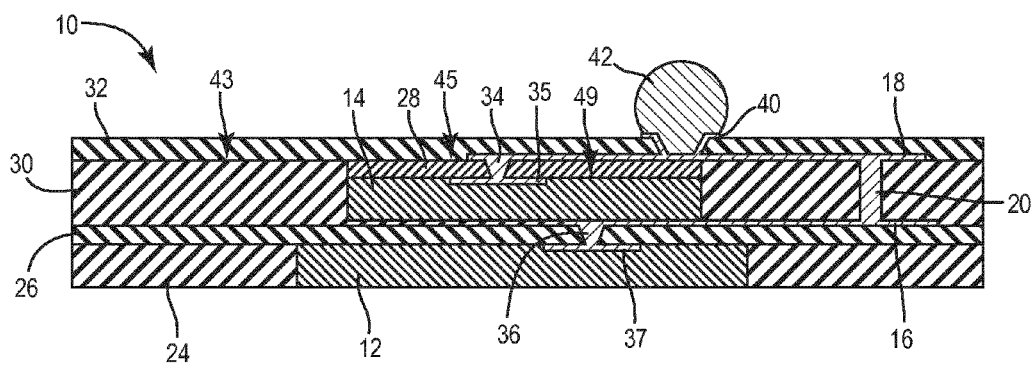
FIG. 1 is a cross sectional view schematic drawing of a SiP according to some embodiments.

Before turning to the features, which illustrate some exemplary embodiments in detail, it should be understood that the application is not limited to the details or methodology set forth in the description or illustrated in the FIGS. It should also be understood that the terminology is for the purpose of description only and should not be regarded as limiting.

Referring generally to the FIGS., devices can be provided as a system in package (SiP) having two or more ICs or dies in a package according to various exemplary embodiments. The SiP is manufactured using one or more reconstituted wafers in some embodiments. A wafer level three dimensional (3D) integrated SiP achieves a thinner thickness or height (e.g., Z dimension) using one or more reconstituted wafers in some embodiments.

According to some embodiments, the SiP is fabricated by molding a first die into a first reconstituted wafer, providing a first dielectric layer to the first reconstituted wafer, providing one or more first connections to the first die through the first dielectric layer, providing a pillar that is connected to the one or more first connections on the first dielectric layer, attaching a second die to the first dielectric layer, reconstituting the first reconstituted wafer including the second die and the pillar, providing one or more second connections to the second die and the pillar, and providing a second dielectric layer above the second die and the second connections. In some embodiments, a dielectric layer is provided above the second die and the one or more second connections are provided on that dielectric layer and a mold layer associated with the reconstituting operation. The use of the pillar minimizes interconnect path length between stacked dies in some embodiments. According to some embodiments, mold material or a heat spreader covers a backside of the first die. In some embodiments, the first die and/or the second die are more than one die disposed in a side-by-side configuration in respective mold material. In some embodiments, interconnections for the SiP are made without the use of bond wires.

In some embodiments, the more complex die (e.g., the logic die) is assembled into the SiP last after other dies are tested in the reconstituted wafer so that the more complex dies are attached only to sites that are operational, thereby reducing costs associated with manufacturing yield loss before assembly of the logic die. Conventional SiP fabrication techniques often assemble the most complex and highest cost IC into package structure before other dies are integrated. This conventional fabrication order increases the cost associated with any SiPs that have to be discarded due to subsequent SiP manufacturing defects.

In some embodiments, a package includes a first die disposed in a first mold layer and coupled to a first dielectric layer disposed above the first mold layer and a second die disposed in a second mold layer and coupled to a second dielectric layer disposed above the second die. The package also includes a third dielectric layer disposed above the second dielectric layer. The third dielectric layer includes solder balls, pins or solder bumps. A pillar is disposed through the second mold layer and is coupled to a first metal layer disposed above the first dielectric layer. The first metal layer is coupled to the first die, and the pillar is coupled to a second metal layer disposed above the second dielectric layer. The second metal layer is coupled to the second die and at least one of the solder bumps, balls, or pins.

In some embodiments, a method of fabricating an integrated circuit package includes providing a first reconstituted wafer comprising a first die, attaching a first dielectric layer on a top surface of the first reconstituted wafer, and providing a first patterned metal layer on the first dielectric layer. The method also includes providing a pillar on the first patterned metal layer above the first dielectric layer, attaching a second die above the first dielectric layer, forming a second reconstituted wafer comprising the first reconstituted wafer comprising the second die, the first dielectric layer, the first patterned metal layer, and the pillar. The method also includes providing a second dielectric layer above the second reconstituted wafer and providing solder bumps, balls, or pins on the second dielectric layer.

In some embodiments, a method of fabricating a system in package includes providing a first die in a first mold layer, attaching a first dielectric layer on a top surface of the first mold layer, providing a first patterned metal layer on the first dielectric layer, and providing a pillar coupled to the first patterned metal layer above the first dielectric layer. The method also includes attaching a second die above the first dielectric layer, providing mold material above the first dielectric layer to a level above a top surface of the second die, providing a second dielectric layer above the second die, and providing a second patterned metal material above the second dielectric layer. The second patterned metal material is coupled to the pillar.

With reference to FIG. 1, a system in package (SiP) 10 includes a die 12, a die 14, a metal layer 16, a metal layer 18, a pillar 20, a mold layer 24, a dielectric layer 26, a dielectric layer 28, a mold layer 30, and a dielectric layer 32. Dielectric layer 32 includes an input/output (I/O) pad 40 coupled to a solder ball 42. Solder ball 42 is a pin, solder bump, or other structure for coupling SiP 10 to circuit boards or other devices in some embodiments.

Die 12 can be one of several dies provided in mold layer 24. Die 12 and mold layer 24 are provided as a first reconstituted wafer in some embodiments. Die 14 can be one of several dies provided in mold layer 30 which is part of a second reconstituted wafer including the first reconstituted wafer in some embodiments. Dies 12 and 14 can be manufactured using various semiconductor fabrication technologies and are not limited to dies with any particular structures or devices thereon. Dies 12 and 14 can be any type of electronic device including a memory, a processor, a radio frequency circuit, programmable logic device, application specific integrated circuit (ASIC), or other logic device. In some embodiments, dies 12 and 14 are silicon substrates including ICs and are between 50 and 150 microns thick. However, dies 12 and 14 can have a variety thicknesses depending on die area and system criteria.

In some embodiments, die 12 is a less complex die than die 14 so that the most complex and high cost IC die (e.g., die 14) can be assembled into the structure after die 12 integrated. Advantageously, the more complex die (e.g., die 14) is closer to solder ball 42 and yet is assembled later in the fabrication flow so that more expensive dies do not have to be discarded due to subsequent SiP manufacturing defects (e.g. defects associated with die 12). Partially completed SiP 10 is tested during manufacture and prior to attaching die 14 in some embodiments. In some embodiments, SiP 10 is tested after metal layer 16 is formed, and if the test fails, die 14 is not attached. A dummy die is attached instead in some embodiments.

Die 14 is fabricated to include a pad 35, and die 12 is fabricated to include a pad 37 in some embodiments. Pads 35 and 37 are made from copper alloy material or other conductive material suitable for connections with dies 14 and 12, respectively. Pad 35 is coupled to a via 34 which is coupled to metal layer 18, and pad 37 is coupled to a via 36 which is coupled to metal layer 16 in some embodiments. Metal layers 16 and 18 are coupled to pillar 20 in some embodiments. Metal layer 18 is coupled to I/O pad 40 which is coupled to solder ball 42 in some embodiments.

IC die 12 and mold layer 24 are part of the first reconstituted wafer to which metal layer 16 and dielectric layer 26 are added in some embodiments. The first reconstituted wafer can be reconstituted into another reconstituted wafer (e.g., the second reconstituted wafer) including mold layer 30, dielectric layer 28, and die 14 in some embodiments. The second reconstituted wafer can have a reduced Z form factor in some embodiments. Pillar 20 between metal layer 16 and metal layer 18 provides a short interconnect path between stacked dies 12 and 14 (e.g., between 50 and 150 microns (80 microns) in height) in some embodiments. In some embodiments, pillar 20 provides a smaller path length than conventional interconnections using wire bonds or through mold via interconnections. In addition, the interconnections between dies 12 and 14 of SiP 10 do not suffer from the drawbacks associated with wire bonding two dies that have significantly different peripheries in some embodiments.

Metal layers 16 and 18 are redistribution layers for providing interconnections in SIP 10 in some embodiments. Metal layers 16 and 18 are made from copper alloy materials and are 1-3 microns thick in some embodiments although other conductive materials and thickness are utilized in some embodiments. Metal layers 16 and 18 can provide various interconnections and include various conductors for connecting pads 37 and 35 associated with dies 12 and 14 and I/O pad 40. Although only one interconnection between dies 12 and 14 is shown, multiple numbers of interconnections can be achieved using pillars similar to pillar 20 and conductors or traces associated with metal layers 16 and 18.

Dielectric layers 26 28 and 32 are insulative material in some embodiments. In some embodiments, dielectric layers 26, 28, and 32 are polyimide, benzocyclobutene (BCB) based polymers, silicon dioxide based materials, FR4 materials, low K dielectric materials or other suitable insulative materials. In some embodiments, dielectric layers 26, 28, and 32 are between 2 and 25 microns thick. Dielectric layer 28 is between 10-30 percent of the thickness of die 14 in some embodiments. In some embodiments, dielectric layer 28 has the same area as die 14 (e.g. dielectric layer 28 only covers die 14). A top surface 43 of mold layer 30 is above a top surface 49 of die 14 (e.g., by 3-8 microns (5 microns)) and coplanar with a top surface 45 of dielectric layer 28 in some embodiments. Top surface 49 is an active surface of die 14 in some embodiments.

Mold layers 24 and 30 have a thickness corresponding to the thickness of dies 12 and 14 in some embodiments. Mold layers 24 and 30 are insulative polymer materials. In some embodiments, mold layers are curable insulative materials used in die packaging (e.g., epoxy material).

Metal layers 16 and 18 can provide various interconnections and include various conductors for connecting I/O pads associated with dies 12 and 14. Multiple numbers of conductors associated with metal layers 16 and 18 can extend in various directions within SiP 10. The dimensions, thicknesses and materials disclosed herein are exemplary only. Although only a two die stack configuration is shown, additional layers including dies can be added (e.g., three die stack configuration or more) in some embodiments.

With reference to FIGS. 1-10, the fabrication of SiP 10 is described below. The first and second reconstituted wafers discussed below can be processed in wafer fabrication equipment in some embodiments. The first and second reconstituted wafers are circular or rectangular in some embodiments.

Figure 2:
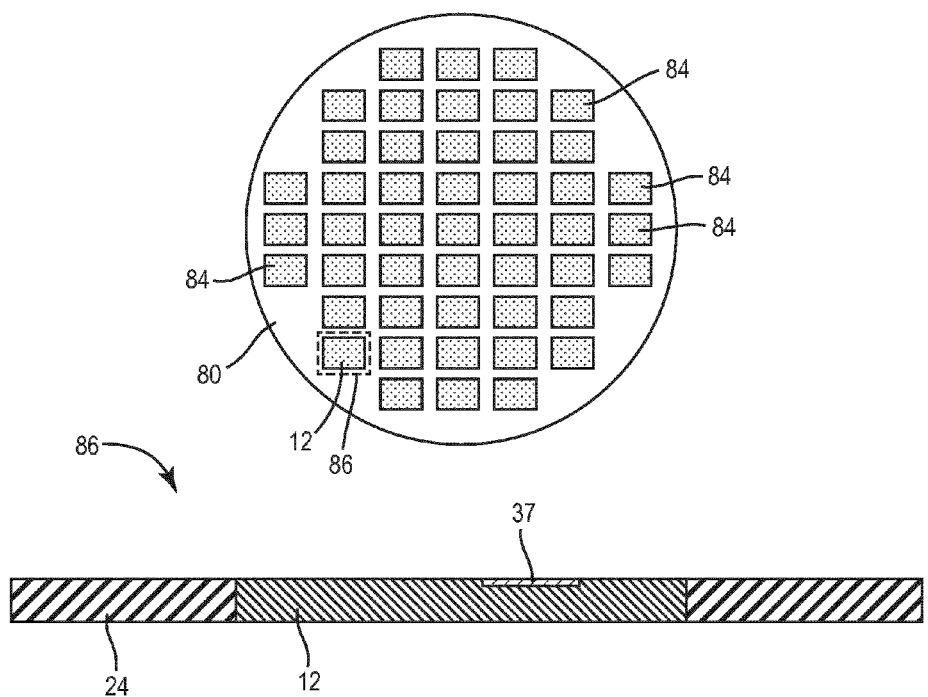
FIG. 2 is a cross sectional view schematic drawing showing a first die molding operation for the fabrication of the SiP illustrated in FIG. 1 according to some embodiments.

With reference to FIG. 2, a reconstituted wafer 80 (e.g., the first reconstituted wafer) includes die 12 and dies 84. Die 12 and dies 84 are provided or mounted in a mold. Tape is used to hold die 12 in the mold in some embodiments. In some embodiments, dies 12 and 84 are provided on a semiconductor wafer and are cut from the semiconductor wafer to form individual dies 12 and 84. The dies 12 and 84 are placed in a mold and the material for mold layer 24 is provided in the mold and cured to form reconstituted wafer 80. A portion 86 of the reconstituted wafer 80 is shown including die 12 and mold layer 24. Although portion 86 is shown, the fabrication operations are performed on the entire wafer in some embodiments.

Mold material (e.g., reconstituted wafer mold compound) for mold layer 24 is provide as a liquid and can seep or bleed over die 12 and dies 84. Mold layer 24 is subjected to a chemical mechanical polish (CMP) or grinding to reduce the thickness of the mold layer 24 and to clean die 12 from the mold material in some embodiments.

Figure 3:
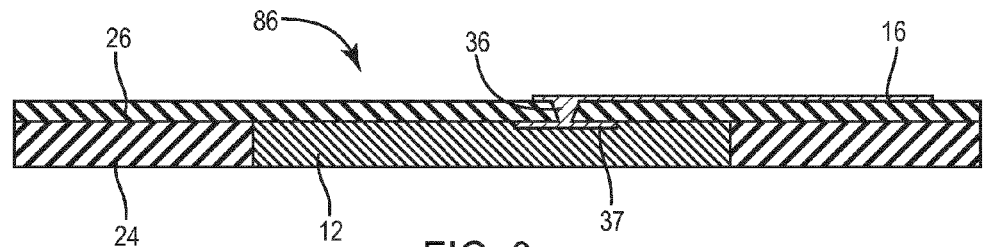
FIG. 3 is a cross sectional view schematic drawing showing a first dielectric layer deposition operation and a first metal layer deposition operation for the fabrication of the SiP illustrated in FIG. 1 according to some embodiments.

With reference to FIG. 3, dielectric layer 26 is deposited above the mold layer 24 and die 12. Dielectric layer 26 is deposited in a chemical vapor deposition (CVD), plasma deposition, polymer deposition or other deposition operation followed by planarization (e.g., CMP) in some embodiments. Dielectric layer 26 is deposited over the entire first reconstituted wafer in some embodiments. Via 36 is formed through the dielectric layer 26 and metal layer 16 is formed above the dielectric layer 26. Via 36 can be formed in a drilling, etching or laser ablation operation to form an aperture, followed by filling the aperture with a conductive material, such as, a copper alloy, to connect to pad 37 in some embodiments. The aperture is filled in a metal deposition (e.g., plating) and etch back operation in some embodiments. Other conductive via processes can be utilized to provide via 36. In some embodiments, photolithography lithography is used to form via 36.

A metal deposition and photoresist patterning operation is utilized to form metal layer 16 above the dielectric layer 26. Metal layer 16 is formed by depositing metal above dielectric layer 26 and selectively etching to provide conductors or conductive traces according to a redistribution layer operation in some embodiments. Metal layer 16 is provided by electro plating, sputtering, CVD, plasma deposition, etc. In some embodiments, metal layer 16 and via 36 are formed in the same process.

Figure 4:
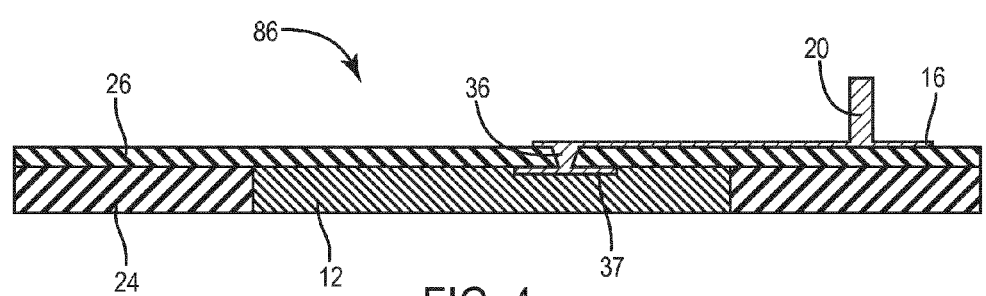
FIG. 4 is a cross sectional view schematic drawing showing a pillar fabrication operation for the fabrication of the SiP illustrated in FIG. 1 according to some embodiments.

With reference to FIG. 4, pillar 20 is formed above a conductor associated with metal layer 16. A metal deposition and photoresist or resin patterning operation is utilized to form pillar 20. In some embodiments, a sacrificial layer (e.g., photoresist) is provided above dielectric layer 26 and metal layer 16. An aperture is provided in the sacrificial layer which has a thickness corresponding to the height of pillar 20. Metal or other conductive material is deposited in the aperture and the sacrificial layer is removed to leave pillar 20. The metal material can be provided by sputtering, plating or combinations thereof. In some embodiments, pillar 20 is selectively grown above metal layer 16. In some embodiments, pillar 20 has a height slightly more than the height of die 12.

Figure 5:
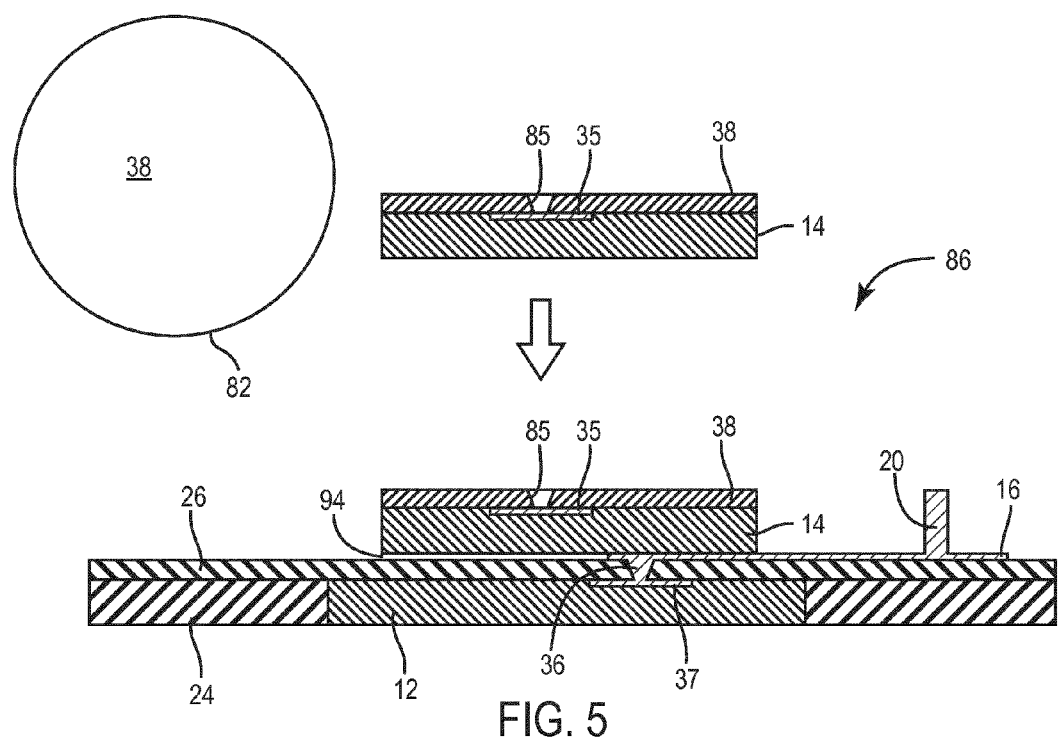
FIG. 5 is a cross sectional view schematic drawing showing an attachment operation for a second die including a second dielectric layer for the fabrication of the SiP illustrated in FIG. 1 according to some embodiments.

With reference to FIG. 5, a wafer 82 includes dielectric layer 38, die 14, and a number of additional dies, similar to die 14. Die 14 including dielectric layer 38 is cut from wafer 82, and die 14 and dielectric layer 38 are placed above die 12 in a mold frame. In some embodiments, die 14 is placed directly above the metal layer 16 and a gap 94 is located between dielectric layer 26 and die 14 where metal layer 16 is not present. Die 14 is attached to die 12 using adhesive in some embodiments.

In some embodiments, an aperture 85 for via 34 is formed through the dielectric layer 38 to expose pad 37 on die 14. Aperture 85 has a diameter of 1-10 microns in some embodiments. Before metal layer 16 is provided, aperture 85 is filled in a deposition operation to form via 34. In some embodiments, aperture 85 or aperture 85 and via 34 are formed before die 14 is cut from wafer 82. Aperture 85 is formed in a photolithographic operation in some embodiments. Via 34 is formed in a similar operation to the operation used to form via 36 in some embodiments. Via 34 is coupled to pad 35 in some embodiments.

Figure 6:
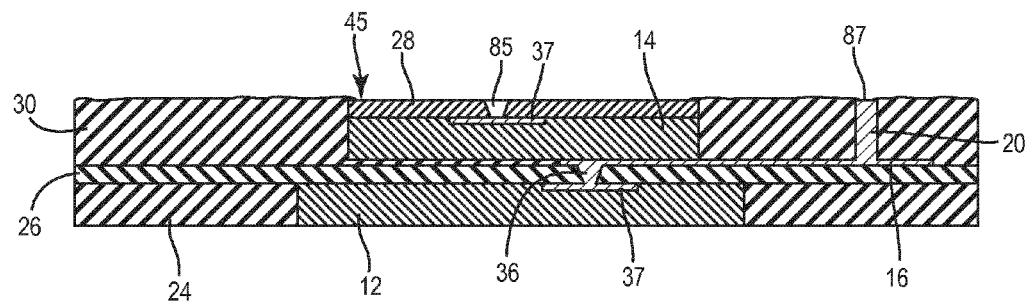
FIG. 6 is a cross sectional view schematic drawing showing a second die molding operation for the fabrication of the SiP illustrated in FIG. 1 according to some embodiments.

With reference to FIG. 6, mold layer 30 is provided to reconstitute the first reconstituted wafer and form a second reconstituted wafer including dies 12 and 14. Mold material for mold layer 30 can cover, bleed or seep over top surfaces 45 and 87 in some embodiments. Mold layer 30 is deposited in the same or similar operation used for mold layer 30 and can initially be less than several microns thicker than die 14 and dielectric layer 38. Pillar 20 and dielectric layer 28 are covered for protection during deposition of mold layer 30 in some embodiments. In some embodiments, ultraviolet (UV) protection tape or other covering is provided above dielectric layer 28 and pillar 20. When mold layer 30 provided, mold material is provided in gaps between dielectric layer 26 and die 14 (e.g., gap 94 (FIG. 5).

Figure 7:
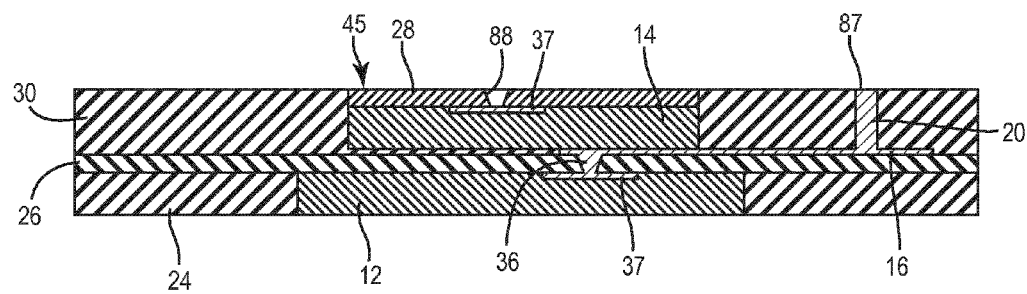
FIG. 7 is a cross sectional view schematic drawing showing a planarization operation for the fabrication of the SiP illustrated in FIG. 1 according to some embodiments.

With reference to FIG. 7, after mold layer 30 is deposited and cured, mold layer 30 is planarized and made flush with the top surface 45 of the dielectric layer 28. Mold residue is removed such that top surface 45 and top surface 87 are clean in some embodiments. Etch back and planarization operations, such as, CMP or grinding, can be utilized to clean top surfaces 45 and 87 in some embodiments.

Figure 8:
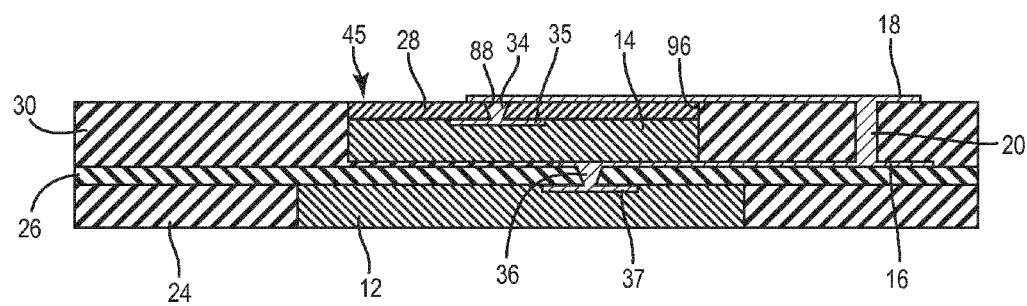
FIG. 8 is a cross sectional view schematic drawing showing a second metal layer deposition operation for the fabrication of the SiP illustrated in FIG. 1 according to some embodiments.

With reference to FIG. 8, metal layer 18 is provided above top surface 45 and mold layer 30. Metal layer 18 can be provided in a similar fashion to metal layer 16. Metal layer 18 is provided according to a fan out wafer level operation in some embodiments. Metal material for metal layer 18 is provided over the entire second reconstituted wafer and selectively etched to leave conductive patterns or traces for the second reconstituted wafer in some embodiments. Metal layer 18 is provided in a similar operation to the operation for formation of metal layer 16 in some embodiments.

Figure 9:
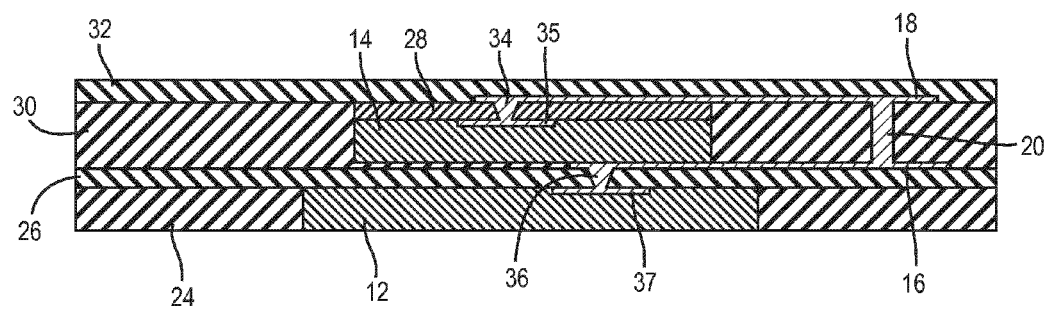
FIG. 9 is a cross sectional view schematic drawing showing a third dielectric layer deposition operation for the fabrication of the SiP illustrated in FIG. 1 according to some embodiments.

With reference to FIG. 9, dielectric layer 32 is provided above metal layer 18 and mold layer 30. Dielectric layer 32 is provided in a fashion similar to dielectric layer 26.

Figure 10:
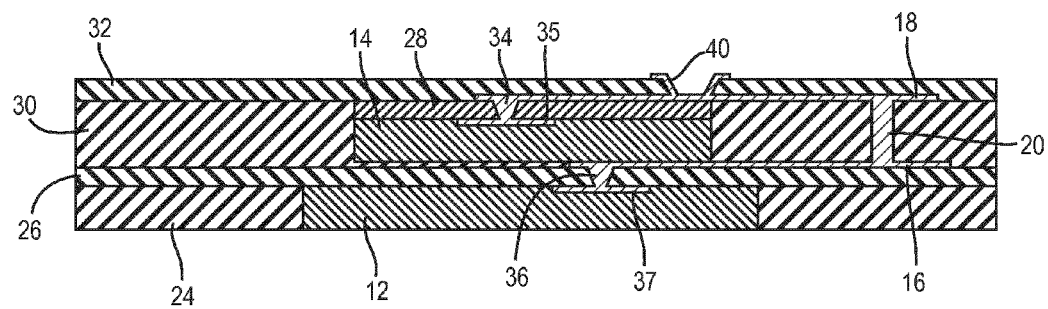
FIG. 10 is a cross sectional view schematic drawing showing an input/output (I/O) pad formation operation for the fabrication of the SiP illustrated in FIG. 1 according to some embodiments.

With reference to FIG. 10, an aperture is provided in dielectric layer 32 and I/O pad 40 is formed in the aperture. I/O pad 40 connects to metal layer 18 in some embodiments. The aperture is etched or drilled though dielectric layer 32 to expose a conductor or trace of metal layer 18. A metal layer is deposited above the dielectric layer 32 and is selectively etched to leave a metal layer in the aperture in some embodiments. Other I/O pad formation techniques can be utilized. With reference to FIG. 1, solder ball 42 is attached to I/O pad 40. Solder ball 42 is utilized for a wafer level ball grid array in some embodiments, and solder bumps are utilized for a three dimensional wafer level chip scale package (3D WLCSP) in some embodiments. After solder ball 42 is formed, the second constituted wafer is cut to provide SiP 10 as an individual device.

Figure 11:
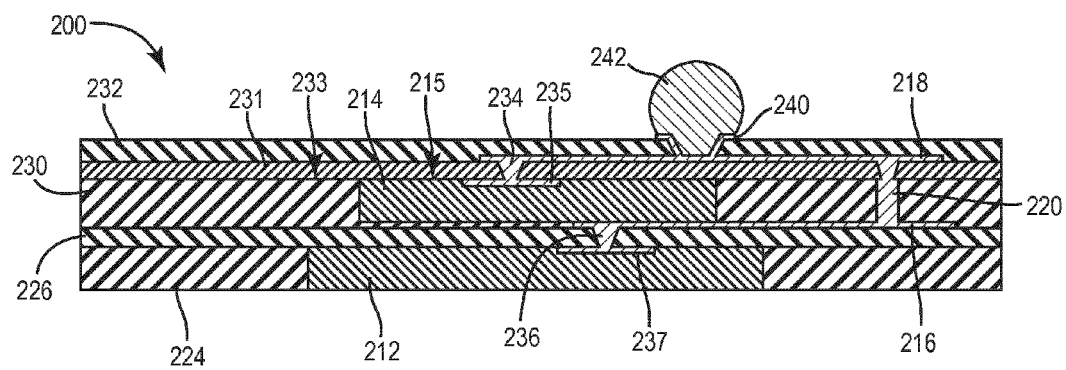
FIG. 11 is a cross sectional view schematic drawing of a SiP according to some embodiments.

With reference to FIG. 11, an SiP 200 is similar to SiP 10 discussed above. Structures shown in FIG. 11 are the same as or similar to the structures shown in FIG. 1 where references numerals in FIG. 11 have a difference of 200 from reference numerals in FIG. 1. SiP 200 does not include dielectric layer 28 shown in FIG. 1. Instead, a die 214 has a top surface 215 corresponding to a top surface 233 of mold layer 230.

Figure 12:
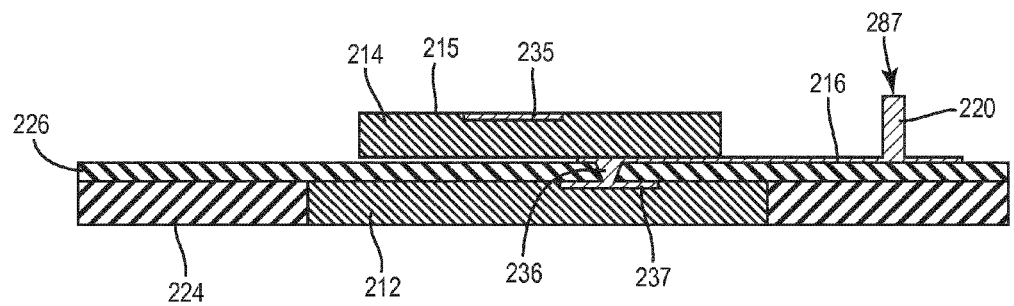
FIG. 12 is a cross sectional view schematic drawing showing a die attachment operation for a second die for the fabrication of the SiP illustrated in FIG. 11 according to some embodiments.

With reference to FIGS. 11-19, the fabrication of SiP 200 is described. With reference to FIG. 12, a first reconstituted wafer including die 212, die 214, a metal layer 216, a dielectric layer 226, a mold layer 224, a pillar 220, and a via 236 is formed in accordance with the operations described above for forming the first reconstituted wafer associated with mold layer 24, die 12, metal layer 16, pillar 20, dielectric layer 26, and via 36 discussed with reference to FIGS. 1-4.

Via 236 is coupled to pad 237 and metal layer 216 in some embodiments. Metal layer 216 is coupled to pillar 220. Die 214 including a pad 235 is provided on top of dielectric layer 226 and metal layer 216. Die 214 is attached to dielectric layer 226 of the first reconstituted wafer associated with die 212 in some embodiments. Die 214 can be placed on dielectric layer 226 and held within a mold frame by tape in some embodiments. The tape can be as large as the first reconstituted wafer and include a number of dies similar to die 14 positioned for attachment of corresponding dies similar to die 12. Dies 214 and 216 have a thickness of less than 100-200 microns in some embodiments. Pillar 220 has a height of 50-200 microns and a diameter of 50-200 microns in some embodiments.

Figure 13:
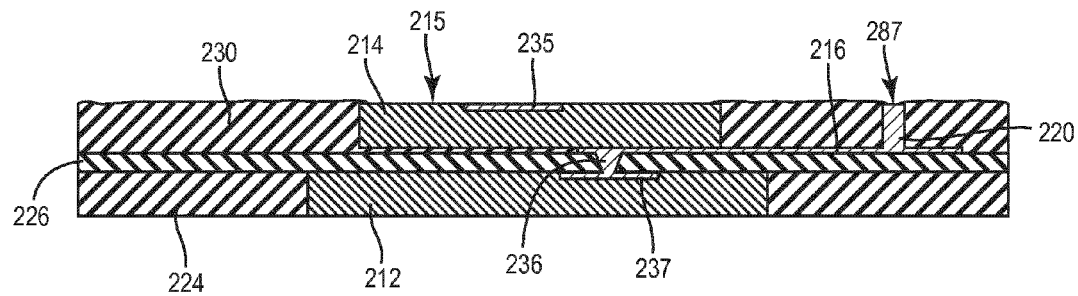
FIG. 13 is a cross sectional view schematic drawing showing a second die molding operation for the fabrication of the SiP illustrated in FIG. 11 according to some embodiments.

With reference to FIG. 13, a mold layer 230 is provided above the dielectric layer 226 and is above a top surface 215 of die 214. Mold layer 230 is provided by depositing mold material into the mold frame to form a second reconstituted wafer including the first reconstituted wafer associated with die 212 in some embodiments. A top surface 215 of die 214 and a top surface 287 of pillar 220 are protected by a covering (e.g., tape) in some embodiments. Mold flash can partially cover top surface 287 and 215 when mold layer 230 is deposited.

Figure 14:
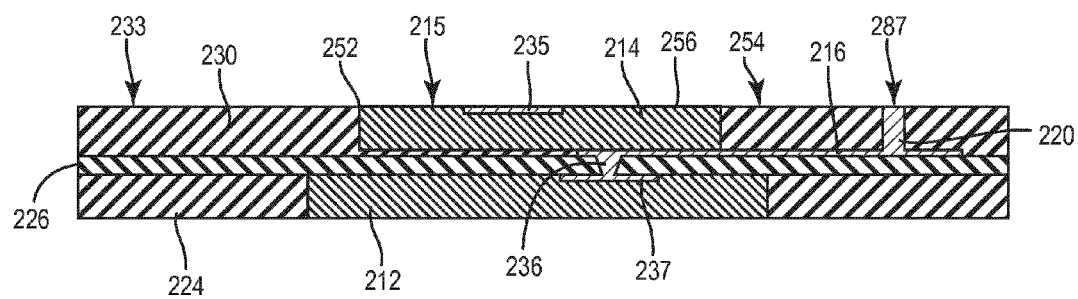
FIG. 14 is a cross sectional view schematic drawing showing a mold flash clean operation for the fabrication of the SiP illustrated in FIG. 11 according to some embodiments.

With reference to FIG. 14, after curing mold layer 230, pillar 220 and die 214 are molded in the mold compound associated with mold layer 230. Mold layer 230 is subjected to planarization operation, such as a CMP, grinding or other etching technique. The level of a top surface 233 of mold layer 230 is slightly below top surface 287 of pillar 220 and top surface 215 of die 214 after the CMP in some embodiments. In some embodiments, a chemical etch is used to lower the top surface 233 of mold layer 230 (e.g., the chemical etch is more selective to the material of mold layer 230 than the material of die 214 and pillar 220).

Figure 15:
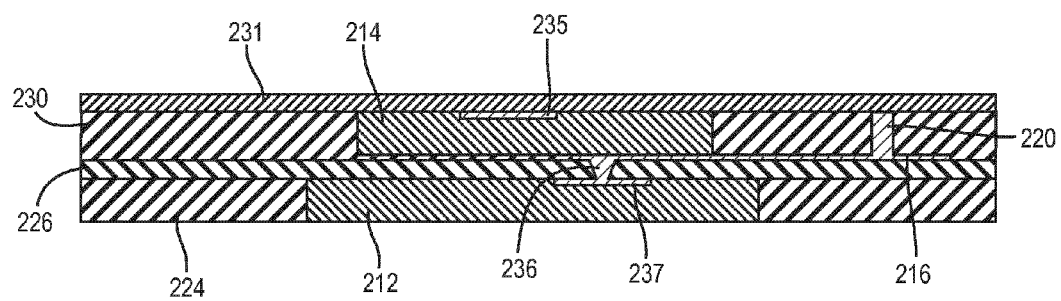
FIG. 15 is a cross sectional view schematic drawing showing a second dielectric layer deposition operation for the fabrication of the SiP illustrated in FIG. 11 according to some embodiments.

With reference to FIG. 15, dielectric layer 231 is deposited above pad 235, die 214 and layer 230. Dielectric layer 231 is subjected to a planarization operation after deposition (e.g., chemical mechanical polish) and is deposited across the entire surface of the second reconstituted wafer in some embodiments. Dielectric layer 231 is similar to dielectric layer 226 and formed in a similar fashion in some embodiments.

Figure 16:
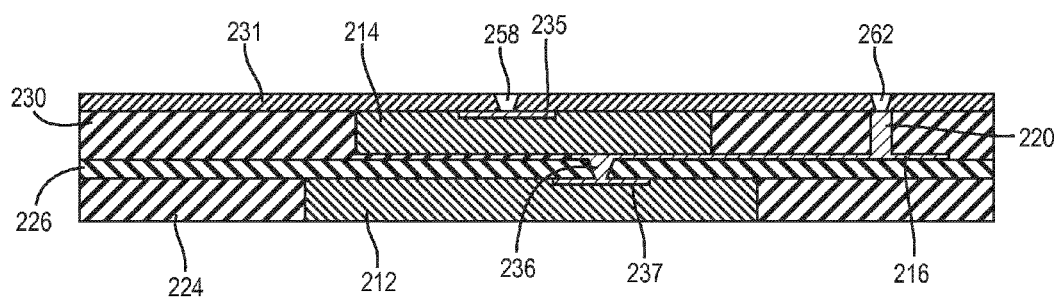
FIG. 16 is a cross sectional view schematic drawing showing an etch or drill operation for the fabrication of the SiP illustrated in FIG. 11 according to some embodiments.

With reference to FIG. 16, an aperture 258 and an aperture 262 are provided in the dielectric layer 231 to expose pad 235 and pillar 220, respectively. Apertures 258 and 262 are formed by etching or drilling through the dielectric layer 231 to expose the pads 235 and pillar 220, respectively.

Figure 17:
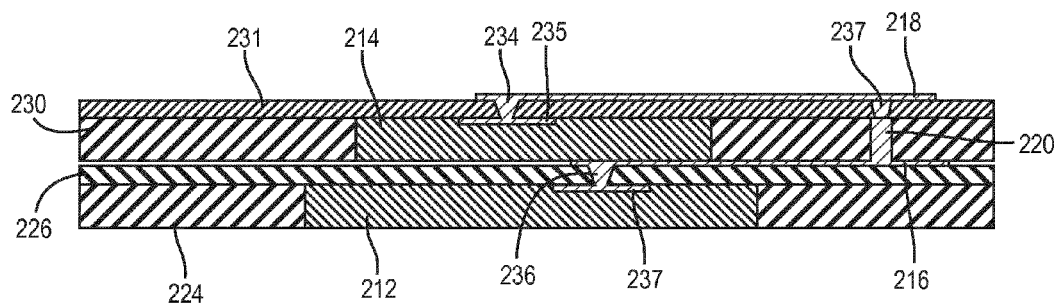
FIG. 17 is a cross sectional view schematic drawing showing a second metal layer deposition operation for the fabrication of the SiP illustrated in FIG. 11 according to some embodiments.

With reference to FIG. 17, apertures 258 and 262 are of variable sizes (e.g. 50-20 microns). Via 234 fills aperture 258 (FIG. 16) and a via 237 fills aperture 262. Vias 234 and 237 are similar to via 236 and formed in a similar fashion in some embodiments. A metal layer 218 is provided in a metal deposition and etch operation. Advantageously, metal layer 218 is provided entirely over dielectric layer 231 as opposed to partially over mold layer 230 in some embodiments.

Figure 18:
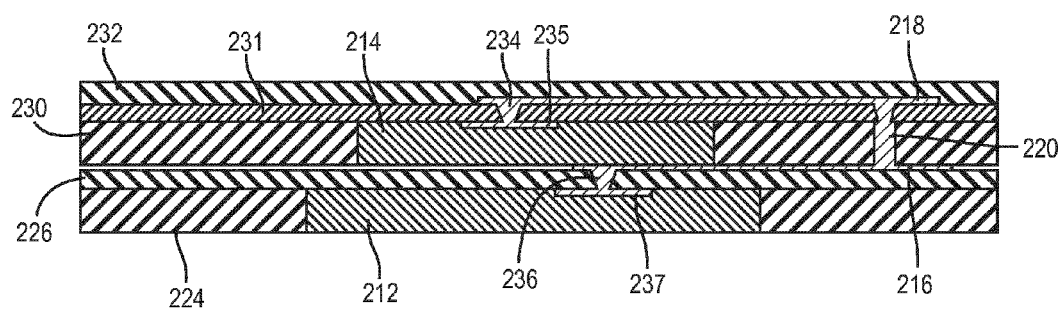
FIG. 18 is a cross sectional view schematic drawing showing a third dielectric layer deposition operation for the fabrication of the SiP illustrated in FIG. 11 according to some embodiments.
Figure 19:
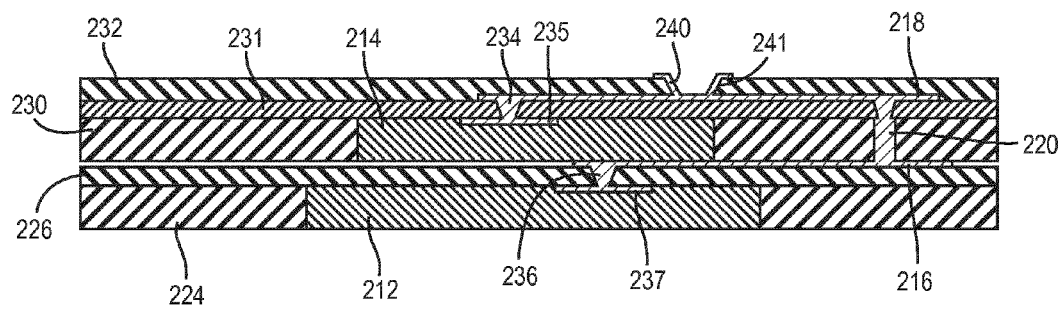
FIG. 19 is a cross sectional view schematic drawing showing an I/O pad formation operation for the fabrication of the SiP illustrated in FIG. 11 according to some embodiments.

With reference to FIG. 18, a dielectric layer 232 is deposited above dielectric layer 231 and metal layer 218 and planarized. With reference to FIG. 19, an I/O pad 240 is provided in an aperture 241 provided in dielectric layer 232. Aperture 241 is formed in an etching or drilling operation to expose the metal layer 234 in some embodiments. After the aperture 241 is formed, an I/O pad formation operation can be utilized to form I/O pad 240 in aperture 241. With reference to FIG. 10, a solder ball 240 is provided on I/O pad 240.

Figure 20:
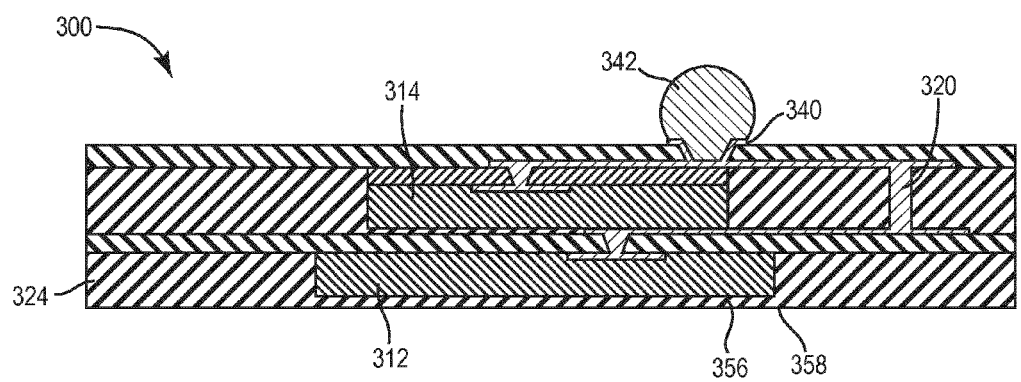
FIG. 20 is a cross sectional view schematic drawing of a SiP according to some embodiments.

With reference to FIG. 20, an SiP 300 is similar to SiP 10. However, SiP 300 includes mold material 356 between a bottom surface 356 of die 312 and a bottom surface 358 of mold layer 324. Structures shown in FIG. 20 are the same as or similar to the structures shown in FIG. 1 where reference numerals in FIG. 20 have a difference of 300 from the reference numerals in FIG. 1. The structure of SiP 200 (FIG.

11) includes mold material between a bottom of die 212 and a bottom surface of mold layer 224 in some embodiments.

Figure 21:
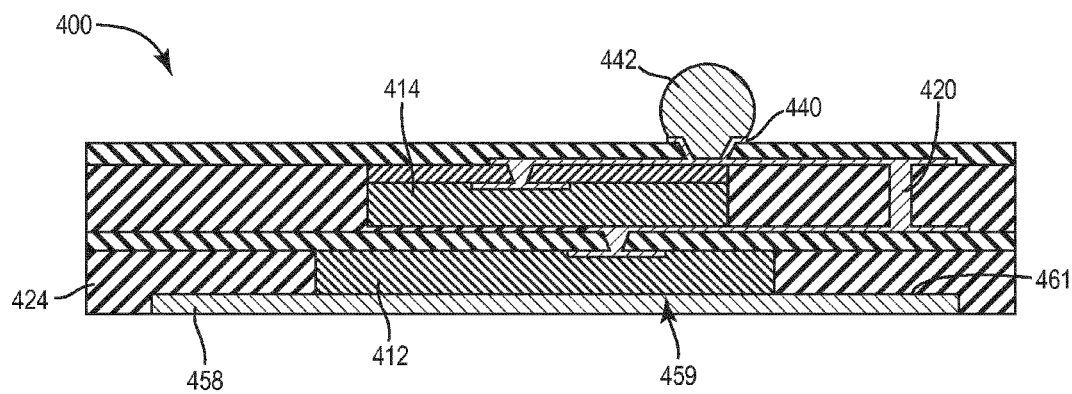
FIG. 21 is a cross sectional view schematic drawing of a SiP according to some embodiments.

With reference to FIG. 21, an SiP 400 includes a heat spreader 458. Heat spreader 458 is attached to a back surface 459 of die 412. Structures shown in FIG. 21 are the same as or similar to the structures shown in FIG. 1 where reference numerals in FIG. 21 have a difference of 400 from the reference numerals in FIG. 1. In some embodiments, the mold material of mold layer 424 is etched or removed in a routing or drilling operation to expose die 412 and heat spreader 458 is disposed in an aperture 461 and attached to mold layer 424 and die 412 via an adhesive. Heat spreader 458 has a high heat conductivity characteristic in some embodiments. In some embodiments, heat spreader 458 is a metal plate and includes fins or other heat dissipating elements. The structure of SiP 200 (FIG. 11) is used with a heat spreader similar to heat spreader 458 in some embodiments.

With reference to FIGS. 1, 10, 20, 21, SiPs 10, 100, 300 and 400 can be provided with multiple dies located adjacent to each other in each mold layer. For example, dies 412, 312, 112 and 12 can each be multiple dies in a side by side relationship provided in respective mold layers 424, 324, 124 and 24.

The disclosure is described above with reference to drawings. These drawings illustrate certain details of specific embodiments that implement the systems and methods and programs of the present disclosure. However, describing the disclosure with drawings should not be construed as imposing on the disclosure any limitations that are present in the drawings. The embodiments of the present disclosure can be implemented using various types of dies. No claim element herein is to be construed as a "means plus function" element unless the element is expressly recited using the phrase "means for." Furthermore, no element, component or method step in the present disclosure is intended to be dedicated to the public, regardless of whether the element, component or method step is explicitly recited in the claims.

It should be noted that certain passages of this disclosure can reference terms such as "first" and "second" in connection with devices for purposes of identifying or differentiating one from another or from others. These terms are not intended to relate entities or operations (e.g., a first region and a second region) temporally or according to a sequence, although in some cases, these entities can include such a relationship. Nor do these terms limit the number of possible entities or operations. Further, the term source/drain region refers to a source region, a drain region, or a region that can be used as a source or a drain.

It should be understood that the circuits described above can provide multiple ones of any or each of those components. In addition, the structures, circuits and methods described above can be adjusted for various system parameters and design criteria, such as shape, depth, thicknesses, material, etc. Although shown in the drawings with certain components directly coupled to each other, direct coupling is not shown in a limiting fashion and is exemplarily shown. Alternative embodiments include circuits with indirect coupling between the components shown.

It should be noted that although steps are described in an order, it is understood that the order of these steps can differ from what is depicted. Also two or more steps can be performed concurrently or with partial concurrence. Such variation will depend on the software and hardware systems chosen and on designer choice. It is understood that all such variations are within the scope of the disclosure.

While the foregoing written description of the methods and systems enables one of ordinary skill to make and use what is considered presently to be the best-mode thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

What is claimed is:

1. A package, comprising:
   a first die disposed in a first mold layer and coupled to a first dielectric layer disposed above the first mold layer;
   a second die disposed in a second mold layer and coupled to a second dielectric layer disposed above the second die; and
   a third dielectric layer disposed above the second dielectric layer and comprising pins, solder balls, or solder bumps,
   wherein a pillar is disposed through the second mold layer and coupled to a first metal layer disposed above the first dielectric layer, the first metal layer being coupled to the first die,
   wherein the pillar is coupled to a second metal layer disposed above the second dielectric layer, the second metal layer being coupled to the second die and at least one of the solder balls, solder bumps or pins, and
   wherein the pillar is located between the first metal layer and the second metal layer.

2. The package of claim 1, further comprising:
   a first via disposed through the first dielectric layer to a first pad disposed on the first die.

3. The package of claim 1, wherein the first die and the first mold layer are part of a reconstituted wafer.

4. The package of claim 1, wherein the first die, the first mold layer, the first dielectric layer, the second die, the second dielectric layer, and the second mold layer are part of a reconstituted wafer.

5. The package of claim 1, wherein the first die, the first mold layer, the first dielectric layer, the second die, and the second mold layer are part of a reconstituted wafer, wherein the second dielectric layer is above the second mold layer.

6. The package of claim 5, further comprising:
   a third dielectric layer disposed below the second dielectric layer and above the second die, the third dielectric layer having an area, the area being the same as an area of the second die.

7. The package of claim 1, further comprising an integrated heat spreader at a bottom of the first die.

8. The package of claim 1, wherein an inactive side of the first die is covered by the first mold layer.

9. A method of fabricating an integrated circuit package, the method comprising:
   providing a first die in a first mold layer;
   attaching a first dielectric layer on a top surface of the first mold layer;
   providing a first patterned metal layer on the first dielectric layer;
   providing a pillar on the first patterned metal layer above the first dielectric layer;
   attaching a second die above the first dielectric layer;
   providing mold material above the first dielectric layer to a level above a top surface of the second die;
   providing a second dielectric layer above the second die; and providing a second patterned metal layer above the second dielectric layer, wherein the second patterned metal layer is coupled to the pillar, wherein the integrated circuit package comprises:

the first die disposed in the first mold layer and coupled to the first dielectric layer disposed above the first mold layer;

the second die disposed in a second mold layer and coupled to the second dielectric layer disposed above the second die; and a third dielectric layer disposed above the second dielectric layer and comprising pins, solder balls, or solder bumps, wherein the pillar is disposed through the second mold layer and coupled to the first patterned metal layer disposed above the first dielectric layer, the first patterned metal layer being coupled to the first die, wherein the pillar is coupled to the second patterned metal layer disposed above the second dielectric layer, the second patterned metal layer being coupled to the second die and at least one of the solder balls, the solder bumps, or the pins, and wherein the pillar is located between the first patterned metal layer and the second patterned metal layer.

10. The method of claim 9, further comprising providing the third dielectric layer above the second dielectric layer.

11. The method of claim 9, further comprising connecting input/output pads on the third dielectric layer to the second patterned metal layer.

12. The method of claim 11, further comprising providing the solder bumps, the solder balls, or the pins on the input/output pads on the third dielectric layer.

13. A package, comprising:

a first die disposed in a first mold layer and coupled to a first dielectric layer disposed above the first mold layer;

a second die disposed in a second mold layer and coupled to a second dielectric layer, the second dielectric layer disposed above the second die and not disposed above the second mold layer; and a third dielectric layer disposed above the second dielectric layer and comprising pins, solder balls, or solder bumps, wherein a pillar is disposed through the second mold layer and coupled to a first metal layer disposed above the first dielectric layer, the first metal layer being coupled to the first die, and wherein the pillar is coupled to a second metal layer disposed above the second dielectric layer, the second metal layer being coupled to the second die and at least one of the solder balls, solder bumps or pins.

14. The package of claim 13, further comprising:

a first via disposed through the first dielectric layer to a first pad disposed on the first die.

15. The package of claim 13, wherein the first die and the first mold layer are part of a reconstituted wafer.

16. The package of claim 13, wherein the first die, the first mold layer, the first dielectric layer, the second die, the second dielectric layer, and the second mold layer are part of a reconstituted wafer.

17. The package of claim 13, wherein the first die, the first mold layer, the first dielectric layer, the second die, and the second mold layer are part of a reconstituted wafer, wherein the second dielectric layer is above the second mold layer.

18. The package of claim 17, further comprising:

a third dielectric layer disposed below the second dielectric layer and above the second die, the third dielectric layer having an area, the area being the same as an area of the second die.

19. The package of claim 13, further comprising an integrated heat spreader at a bottom of the first die.

20. The package of claim 13, wherein an inactive side of the first die is covered by the first mold layer.

* * * * *